United States Patent
Do et al.

(10) Patent No.: US 9,406,647 B2
(45) Date of Patent: *Aug. 2, 2016

(54) EXTENDED REDISTRIBUTION LAYERS BUMPED WAFER

(71) Applicant: STATS ChipPAC, Ltd., Singapore (SG)

(72) Inventors: Byung Tai Do, Singapore (SG); Heap Hoe Kuan, Singapore (SG)

(73) Assignee: STATS ChipPAC Pte. Ltd., Singapore (SG)

( * ) Notice: Subject to any disclaimer, the term of this patent is extended or adjusted under 35 U.S.C. 154(b) by 14 days.

This patent is subject to a terminal disclaimer.

(21) Appl. No.: 14/214,120

(22) Filed: Mar. 14, 2014

(65) Prior Publication Data

US 2014/0197540 A1    Jul. 17, 2014

Related U.S. Application Data

(60) Continuation of application No. 12/704,345, filed on Feb. 11, 2010, now Pat. No. 8,716,853, which is a division of application No. 11/744,743, filed on May 4, 2007, now Pat. No. 7,687,318.

(51) Int. Cl.
*H01L 21/56* (2006.01)
*H01L 21/60* (2006.01)
(Continued)

(52) U.S. Cl.
CPC .............. *H01L 24/97* (2013.01); *H01L 21/568* (2013.01); *H01L 21/6835* (2013.01); *H01L 21/6836* (2013.01); *H01L 24/11* (2013.01); *H01L 24/14* (2013.01); *H01L 24/96* (2013.01); *H01L 23/3114* (2013.01); *H01L 23/3185* (2013.01); *H01L 23/498* (2013.01);
(Continued)

(58) Field of Classification Search
CPC .......................... H01L 23/3185; H01L 23/498
USPC ................ 438/113, 117, 125, 461, 464, 614, 438/FOR. 342

See application file for complete search history.

(56) References Cited

U.S. PATENT DOCUMENTS

| 4,280,273 A | 7/1981 | Vincent |
|---|---|---|
| 6,420,244 B2 | 7/2002 | Lee |

(Continued)

FOREIGN PATENT DOCUMENTS

| JP | 401280340 A | 11/1989 |
|---|---|---|
| KR | 1020060134195 | 12/2006 |

(Continued)

*Primary Examiner* — George Fourson, III
(74) *Attorney, Agent, or Firm* — Robert D. Atkins; Patent Law Group: Atkins and Associates, P.C.

(57) ABSTRACT

A semiconductor device is manufactured by, first, providing a wafer, designated with a saw street guide, and having a bond pad formed on an active surface of the wafer. The wafer is taped with a dicing tape. The wafer is singulated along the saw street guide into a plurality of dies having a plurality of gaps between each of the plurality of dies. The dicing tape is stretched to expand the plurality of gaps to a predetermined distance. An organic material is deposited into each of the plurality of gaps. A top surface of the organic material is substantially coplanar with a top surface of a first die of the plurality of dies. A redistribution layer is patterned over a portion of the organic material. An under bump metallization (UBM) is deposited over the organic material in electrical communication, through the redistribution layer, with the bond pad.

18 Claims, 17 Drawing Sheets

(51) Int. Cl.
*H01L 23/00* (2006.01)
*H01L 21/683* (2006.01)
*H01L 23/31* (2006.01)
*H01L 23/498* (2006.01)

(52) U.S. Cl.
CPC ............ *H01L 2221/68327* (2013.01); *H01L 2221/68359* (2013.01); *H01L 2224/0401* (2013.01); *H01L 2224/04105* (2013.01); *H01L 2224/13099* (2013.01); *H01L 2224/20* (2013.01); *H01L 2924/01002* (2013.01); *H01L 2924/014* (2013.01); *H01L 2924/01005* (2013.01); *H01L 2924/01006* (2013.01); *H01L 2924/01013* (2013.01); *H01L 2924/01015* (2013.01); *H01L 2924/01022* (2013.01); *H01L 2924/01029* (2013.01); *H01L 2924/01033* (2013.01); *H01L 2924/01047* (2013.01); *H01L 2924/01074* (2013.01); *H01L 2924/01075* (2013.01); *H01L 2924/01078* (2013.01); *H01L 2924/01079* (2013.01); *H01L 2924/09701* (2013.01); *H01L 2924/12042* (2013.01); *H01L 2924/14* (2013.01); *H01L 2924/15173* (2013.01); *H01L 2924/15311* (2013.01); *H01L 2924/15787* (2013.01); *H01L 2924/30105* (2013.01)

(56) References Cited

U.S. PATENT DOCUMENTS

| | | | |
|---|---|---|---|
| 6,566,239 | B2 | 5/2003 | Makino et al. |
| 6,787,895 | B1 | 9/2004 | Jarcy et al. |
| 6,852,607 | B2 | 2/2005 | Song et al. |
| 7,208,344 | B2 | 4/2007 | Ho |
| 7,208,345 | B2 | 4/2007 | Meyer et al. |
| 7,413,929 | B2 | 8/2008 | Lee et al. |
| 7,750,452 | B2 | 7/2010 | Do et al. |
| 2003/0119297 | A1 | 6/2003 | Lam et al. |
| 2005/0255686 | A1 | 11/2005 | Yamano et al. |
| 2006/0250049 | A1 | 11/2006 | Park et al. |
| 2007/0114661 | A1 | 5/2007 | Choi et al. |
| 2009/0085186 | A1 | 4/2009 | Meyer |
| 2009/0102002 | A1 | 4/2009 | Chia et al. |
| 2009/0283870 | A1 | 11/2009 | Pagaila et al. |
| 2010/0203684 | A1 | 8/2010 | Choi et al. |
| 2010/0230822 | A1 | 9/2010 | Pagaila et al. |

FOREIGN PATENT DOCUMENTS

| | | |
|---|---|---|
| TW | 502344 B | 9/2002 |
| TW | 200605283 | 2/2006 |
| WO | 2005104187 | 11/2005 |

US 9,406,647 B2

EXTENDED REDISTRIBUTION LAYERS BUMPED WAFER

CLAIM TO DOMESTIC PRIORITY

The present application is a continuation of U.S. application Ser. No. 12/704,345, now U.S. Pat. No. 8,716,853, filed Feb. 11, 2010, which is a division of U.S. patent application Ser. No. 11/744,743, now U.S. Pat. No. 7,687,318, filed May 4, 2007, which applications are incorporated herein by reference.

FIELD OF THE INVENTION

The present invention relates in general to semiconductor devices and, more particularly, to a bumped wafer structure having extended redistribution layers.

BACKGROUND OF THE INVENTION

Wafer-Level Packaging (WLP) refers to the technology of packaging an integrated circuit at wafer level, instead of the traditional process of assembling the package of each individual unit after wafer dicing. Wafer-level packaging is essentially a true chip-scale packaging (CSP) technology, since the resulting package is practically of the same size as the die. Wafer-level packaging consists of extending the wafer fabrication processes to include device interconnection and device protection processes. In many cases, redistribution layer and bump technology is used to facilitate the packaging.

Wafer-level packages using bump technology extend the conventional wafer fabrication ("fab") process with an additional step that deposits a multi-layer thin-film metal rerouting and interconnection system to each device on the wafer. The interconnection system is achieved using the same standard photolithography and thin film deposition techniques employed in the device fabrication itself.

The additional level of interconnection redistributes the peripheral bonding pads of each chip to an area array of under bump metallization (UBM) pads that are evenly deployed over the chip's surface. The solder balls or bumps used in connecting the device to the application circuit board are subsequently placed over the UBM pads. Aside from providing the WLP's means of external connection, use of redistribution layer and bump technology also improves a respective chip's reliability by allowing the use of larger and more robust balls for interconnection, resulting in better thermal management of a semiconductor device's input/output (I/O) system.

Bumped die configurations, particularly those including WLP technologies, face increasing pressure to deposit more I/O capability per a specific area. In general, however, the specific area in which to deposit bumps has been traditionally limited.

SUMMARY OF THE INVENTION

In light of the foregoing, the aim of the present invention is to provide a method to increase a top area of a bumped die, for use in applications such as WLP, so that the I/O per specific area can be increased.

Accordingly, in one embodiment, the present invention is a method of making a semiconductor device comprising the steps of providing a plurality of semiconductor die, forming an insulating layer around the semiconductor die, forming a conductive layer over the insulating layer and semiconductor die, forming a UBM over the insulating layer, and forming an interconnect structure over the UBM.

In another embodiment, the present invention is a method of making a semiconductor device comprising the steps of providing a semiconductor die, forming an insulating layer around the semiconductor die, forming a conductive layer over the insulating layer and semiconductor die, and forming a first UBM over the insulating layer.

In another embodiment, the present invention is a semiconductor device comprising a semiconductor die. An insulating layer is formed around the semiconductor die. A conductive layer is formed over the insulating layer. A first UBM is formed over the insulating layer.

In another embodiment, the present invention is a semiconductor device comprising a semiconductor die. An insulating layer is formed coplanar with opposing surfaces of the semiconductor die. A conductive layer is formed over the insulating layer.

DETAILED DESCRIPTION OF THE DRAWINGS

The present invention is described in one or more embodiments in the following description with reference to the Figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Figure 1:
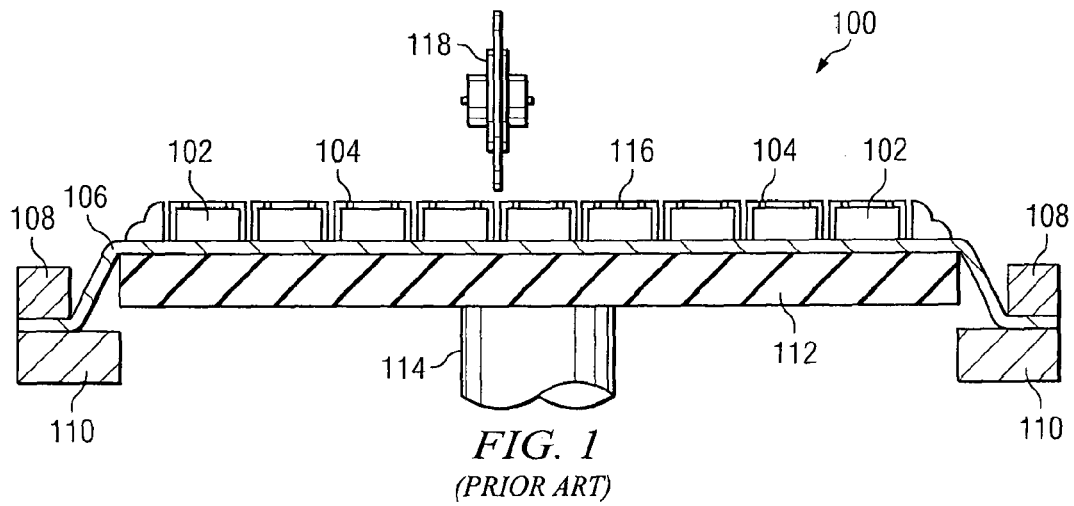
FIG. 1 illustrates an exemplary prior art method of making a wafer level chip scale package.

FIG. 1 illustrates an exemplary prior art method 100 of making a wafer level chip scale package. A plurality of chips 102 are cut from a wafer. Each chip 102 has a plurality of protruding bonding pads 104 located on the active surface of the chip 102.

The plurality of chips 102 are disposed on the top surface of a retractable film 106. The retractable film 106 is secured by a frame 108. The frame 108 is fixed by a fixture 110 and the retractable film 106 is displaced on a work platform 112 and stretched to a certain distance.

The platform 112 can move up relative to the fixture 110. The wafer is cut by a cutter into the plurality of chips 102 as shown which have been encapsulated into semiconductor packages and then sawn by a cutter 118. A shaft 114 moves upward to lift the platform 112 relative to the fixture 110.

The present invention improves upon the exemplary prior art method 100 of manufacture to render a bumped wafer semiconductor device which provides an increased top surface area to accommodate additional bumps. The additional bumps result in greater input/output (I/O) capacity of each chip, without the use of additional wafer material, which can impact wafer yields.

Figure 2A:
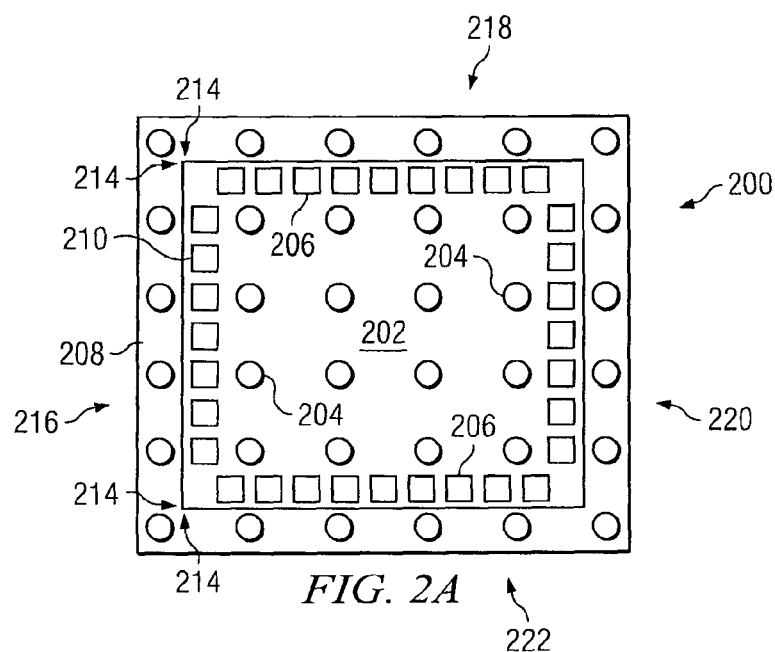
FIG. 2A illustrates one embodiment of an extended redistribution layer (RDL) bumped wafer, in a top view.

FIG. 2A illustrates one embodiment of an extended redistribution layer (RDL) bumped wafer, in a top view. Device 200 has an incorporated die 202. Device 200 includes a plurality of bumps 204 which are deposited in the depicted configuration. The bumps 204 can be made from a conductive metal, such as various solders and gold (Au).

The device 200 includes a plurality of bond pads 206 which are deposited on an active side of the semiconductor die 202. The bonding pads 206 can be deposited on the electrode terminals of the die 202 by a plating process, or otherwise. Like the bumps 204, the materials of the bonding pads 206 can also be made from conductive metal, such as aluminum (Al). The bonding pads 206 can be joined to a substrate by a soldering process.

Figure 2B:
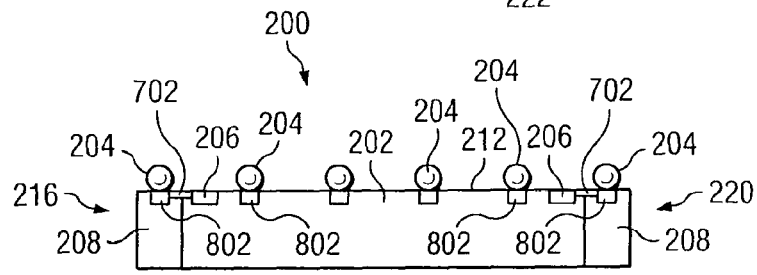
FIG. 2B illustrates a side view of the embodiment depicted in FIG. 2A.

A series of metal traces, as will be further illustrated, electrically couple the bond pads 206 to the bumps 204 via an under bump metallization (UBM) 802 shown in FIG. 2B. The surrounding material 208, which is, for purposes of the present invention, referred to as an "organic material" is deposited around a peripheral surface 214 of the die 202 as shown. The organic material is an improvement and a departure from that of the prior art, as will be further described. The organic material can include such materials as benzocyclobutene (BCB), a polyimide (PI) material, or similar material.

As shown, several bumps 204 are formed over the organic material 208 and organized according to rows. In the present embodiment 200, the bumps 204 are formed on each side 216, 218, 220, and 222 of the die 202 in the respective organic material 208.

FIG. 2B illustrates a side view of the embodiment 200 depicted in FIG. 2A. Here again, the die 202 is shown surrounded on the left side 216 and right side 220 by the organic material 208. The bumps 204 are disposed on an active surface 212 of the die 202. A series of redistribution layers (RDL) 210 electrically couple the bumps 204 to the bond pads 206 via UBMs 802 as shown.

Figure 2C:
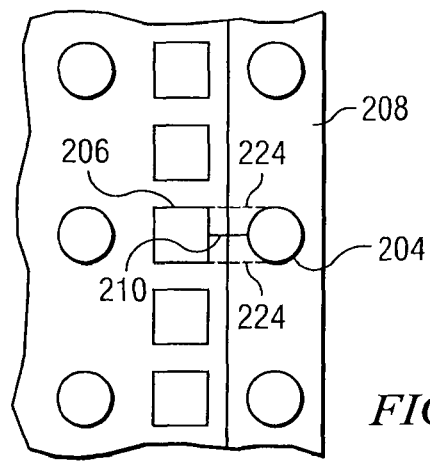
FIG. 2C illustrates a close view of a redistribution layer incorporating redistribution traces in electrical communication between an under bump metallization (UBM) and a bond pad.

FIG. 2C illustrates a close view of a redistribution layer 210 (denoted by line 210) incorporating redistribution traces (denoted by lines 224) in electrical communication between a bump 204 and a bond pad 206. The redistribution traces 224 can be integrated in the redistribution layer 210 using conventional techniques.

Figure 3A:
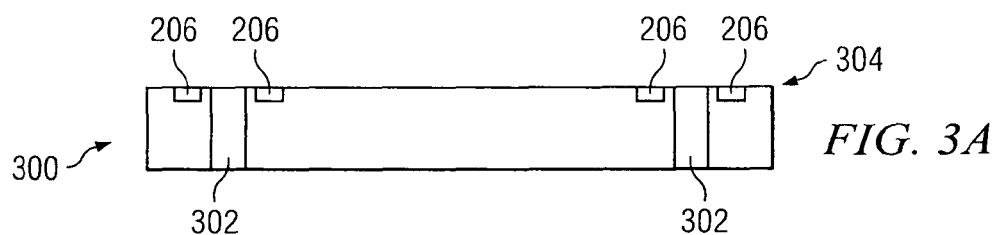
FIGS. 3A and 3B illustrate a first step in an exemplary method of manufacturing an extended redistribution layer bumped wafer in a side view and a top view, respectively.
Figure 3B:
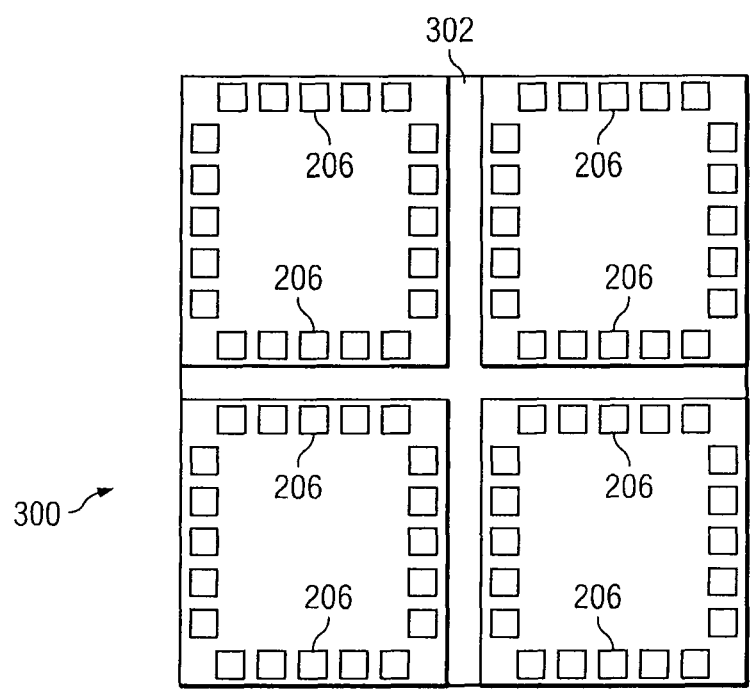

FIGS. 3A and 3B illustrate a first step in an exemplary method of manufacturing an extended redistribution layer bumped wafer in a side view and a top view, respectively. A wafer 300 is provided, which is designated by a series of saw street guides 302. The bond pads 206 are integrated into the top surface 304 of the wafer 300 as shown.

Figure 4A:
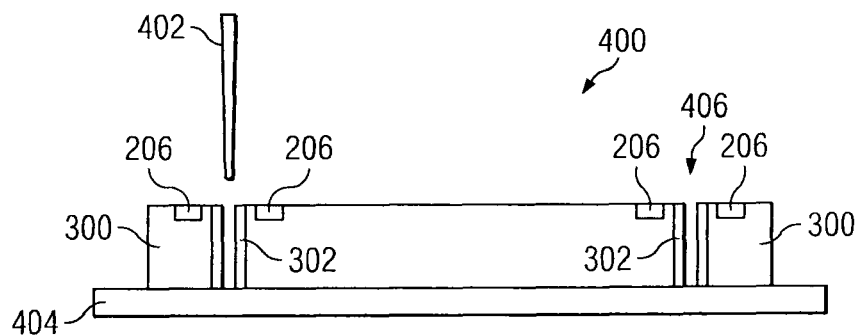
FIGS. 4A and 4B illustrate a second step in the exemplary method of manufacturing, again in a side view and top view, respectively.
Figure 4B:
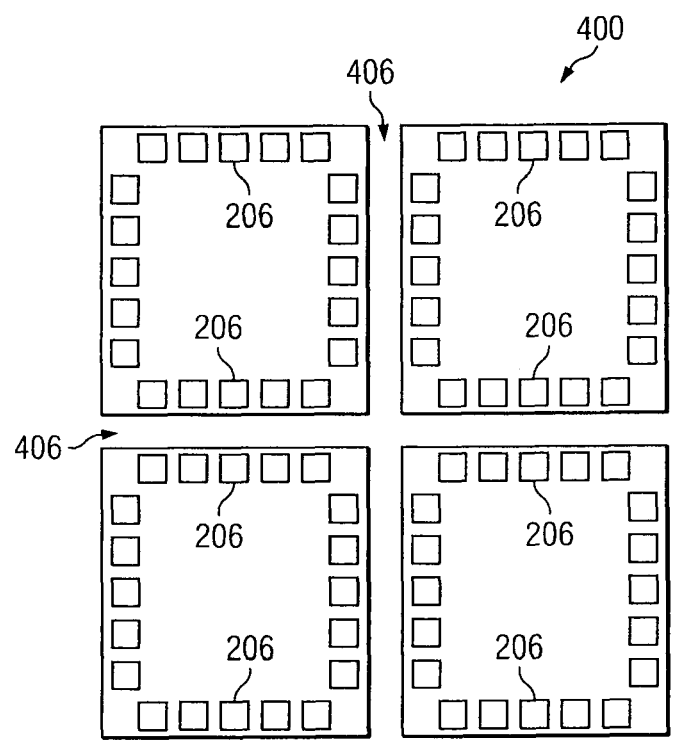

FIGS. 4A and 4B illustrate a second step in the exemplary method of manufacturing, again in a side view and top view, respectively. The wafer 300 is attached to a dicing tape 404. The wafer 300 is singulated into the depicted pieces 400 for a first time by a cutting source 402. The cutting source 402 can include a saw or a laser cutting tool.

Prior to singulation, the wafer 300 is placed on a dicing tape 404, which keeps the various segments 400 in place during the singulation process. Subsequent to the singulation process, a series of gaps 406 is formed between respective segments 400 as shown.

Figure 5A:
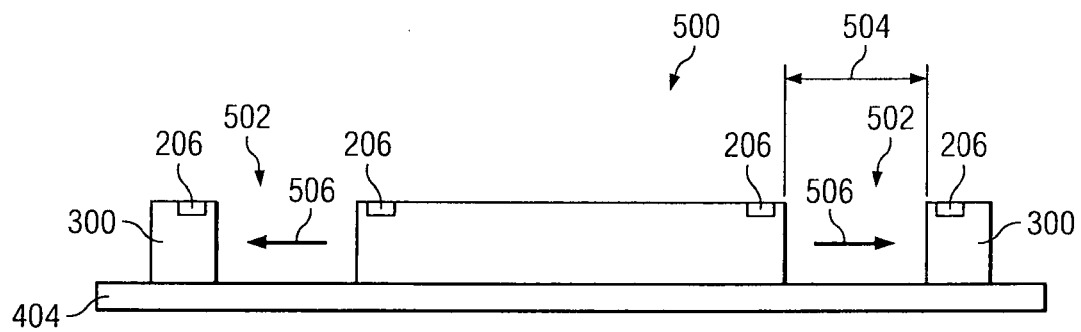
FIGS. 5A and 5B illustrate a third step in the exemplary method of manufacturing, indicating an expansion direction of the wafer segments.
Figure 5B:
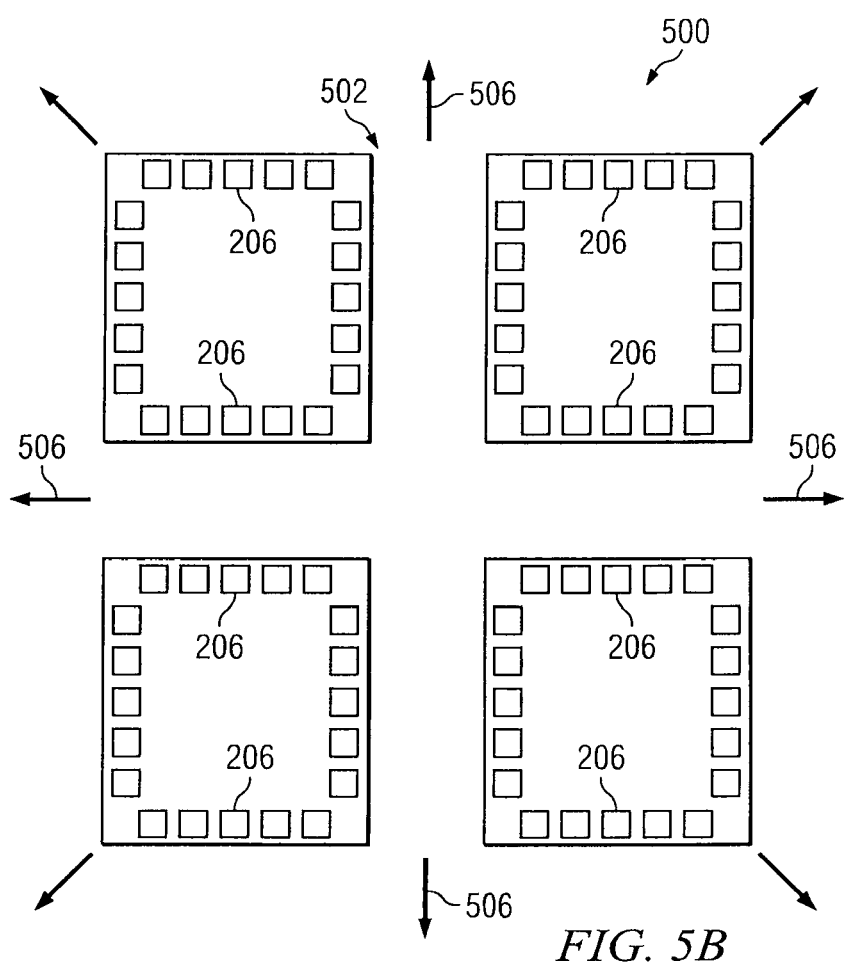

FIGS. 5A and 5B illustrate a third step in the exemplary method of manufacturing, indicating an expansion direction of the wafer segments. Wafer 300, in the depicted respected segments, undergoes an expansion process. The dicing tape 404 can be stretched in various techniques (i.e., by using an expansion table), to render a series of gaps 502 having predetermined distances 504. The depicted arrows 506 indicate the various expansion directions undergone by the wafer expansion process.

Figure 6A:
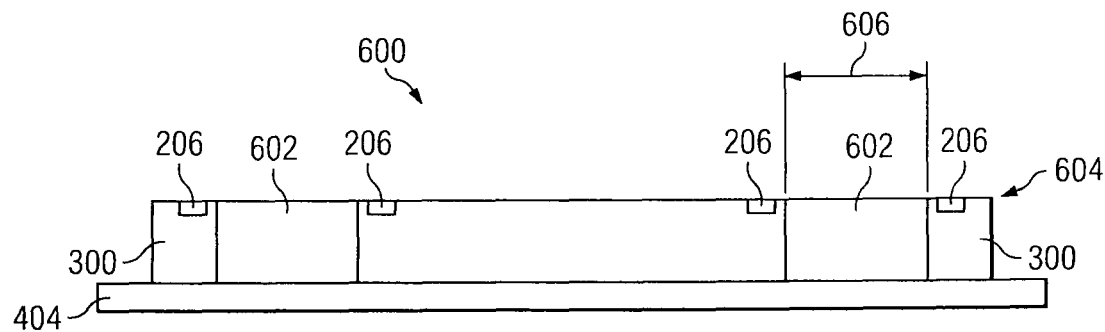
FIGS. 6A and 6B illustrate the deposition of organic material into a plurality of gaps representing a fourth step in the exemplary method of manufacturing.
Figure 6B:
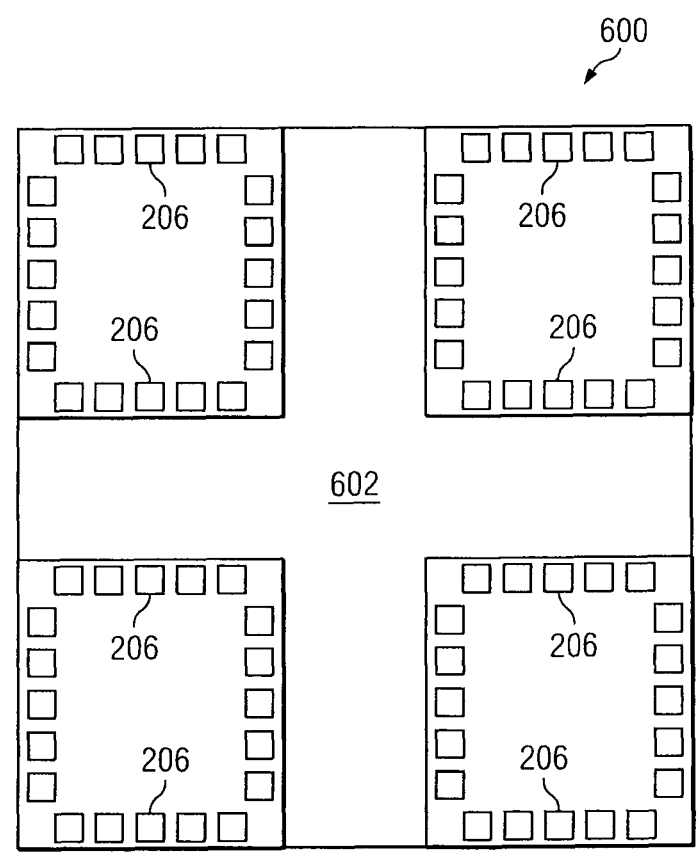

FIGS. 6A and 6B illustrate the deposition of organic material into a plurality of gaps representing a fourth step in the exemplary method of manufacturing. The various gaps 502 seen in FIGS. 5A and 5B are filled with the previously described organic material 208 (here denoted as organic material 602). A plane 604 corresponding to a top surface of the filled segments 600 is substantially coplanar with a plane 606 corresponding to a top surface of the organic material 602.

The organic material 602 application can be performed by such methods as spin-coating, needle dispensing, or a similar application.

Figure 7A:
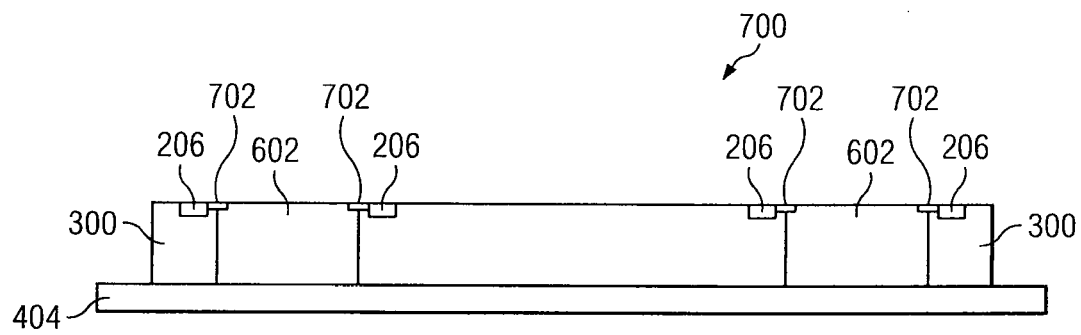
FIGS. 7A and 7B illustrate the patterning of redistribution layers in a fifth step of the exemplary method of manufacturing.
Figure 7B:
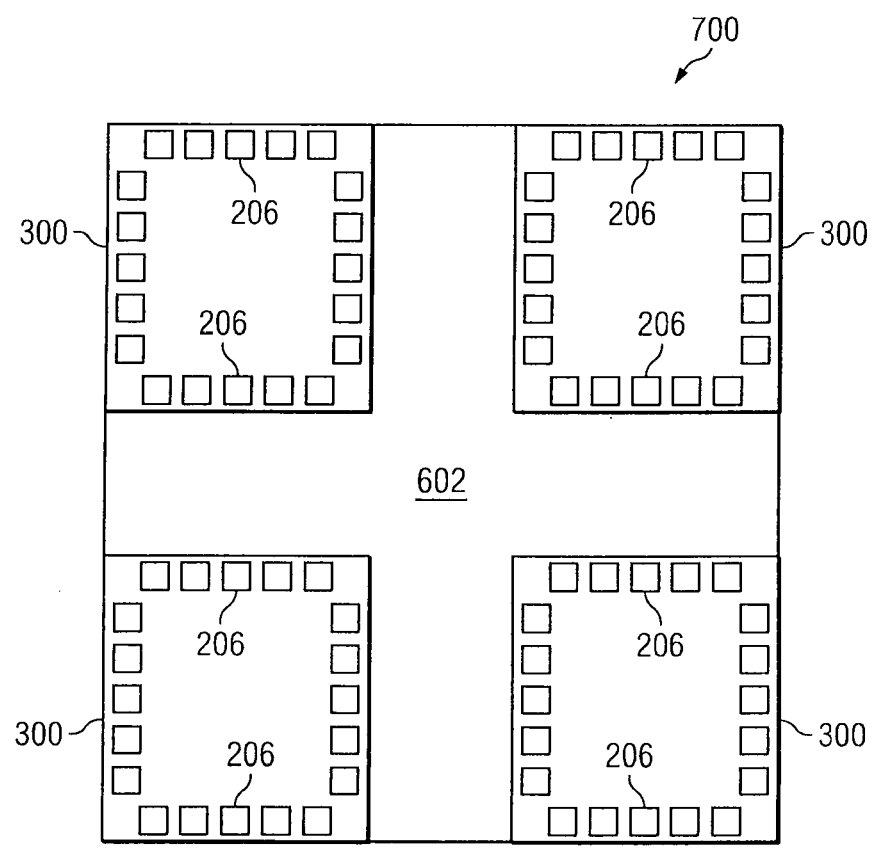

FIGS. 7A and 7B illustrate the patterning of redistribution layers 702 in a fifth step 700 of the exemplary method of manufacturing. The production of a redistribution layer 702, which realizes the electrical connection between active structures and an associated bonding pad 206 on the wafer 300 in the form of a compliant element, can require a plurality of photolithographic process steps. In one embodiment, the wafer segments 300 first have to be coated with a photoresist, which subsequently has to be exposed and developed. The photoresist step is followed by a coating with a metal layer, after which the photoresist is stripped. The steps of photoresist and metal coating process steps are repeated until the desired layer sequence is achieved.

In one embodiment, the patterning of the layers 702 is realized by means of a customary lithographic process. The deposition of a seed layer and Cu/Ni layer situated on redistribution layer 702 follows as a next step. Gold (Au) can be deposited on the entire redistribution layer. The actual electrical conductor in the present example consists of the copper (Cu) metal, which has the lowest electrical resistance. The copper metal can be formed in metal tracings similar to the embodiment conceptualized in FIG. 2C depicting tracings 224.

The described method of patterning and forming the layers 702 can be represented in summary as follows: (a) Deposition of the seed layer, (b) EPR1 (epoxy photoresist 1) Coating and patterning (lithography step 1), (c) Reroute plating, production of the Cu/Ni layer sequence on the seed layer, (d) Coating of the reroute trace with Au, (e) EPR2 (epoxy photoresist 2) coating and patterning (lithography step 2), (f) (as required) selective etching of the Au layer (wet etching, CMP, or removal/stripping).

In the described example method, the nickel (Ni) layer serves as an adhesion layer for the copper (Cu) layer. The copper (Cu) layer, in turn, serves as an adhesion layer for the gold (Au) covering layer. Since the gold (Au) layer cannot oxidize, the gold layer serves, on the one hand, as a secure adhesion layer for a solder material. The copper (Cu) (conductive) layer is largely protected from corrosion by the gold (Au) layer.

As one skilled in the art will appreciate, however, other methods of forming a redistribution layer 702 and associated materials can be utilized for a specific application. Regardless of the method employed or materials used, the purpose of the layers 702 is to provide electrical connectivity from the bond pads 206 to the bumps 204 as will be further described.

Figure 8A:
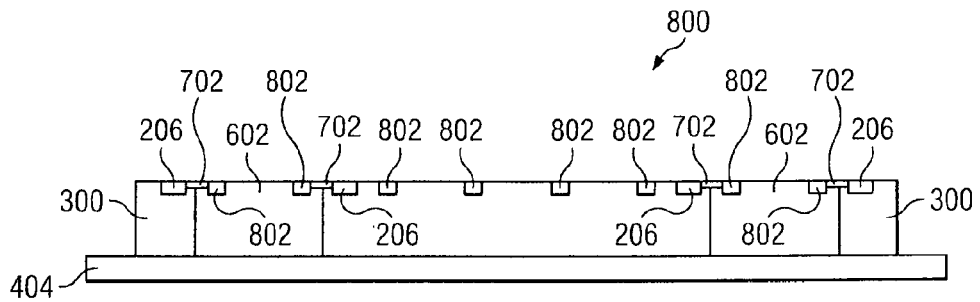
FIGS. 8A and 8B illustrate the formation of a plurality of under bump metallizations (UBMs), some of which are formed over the organic material in a sixth step of the exemplary method of manufacturing.
Figure 8B:
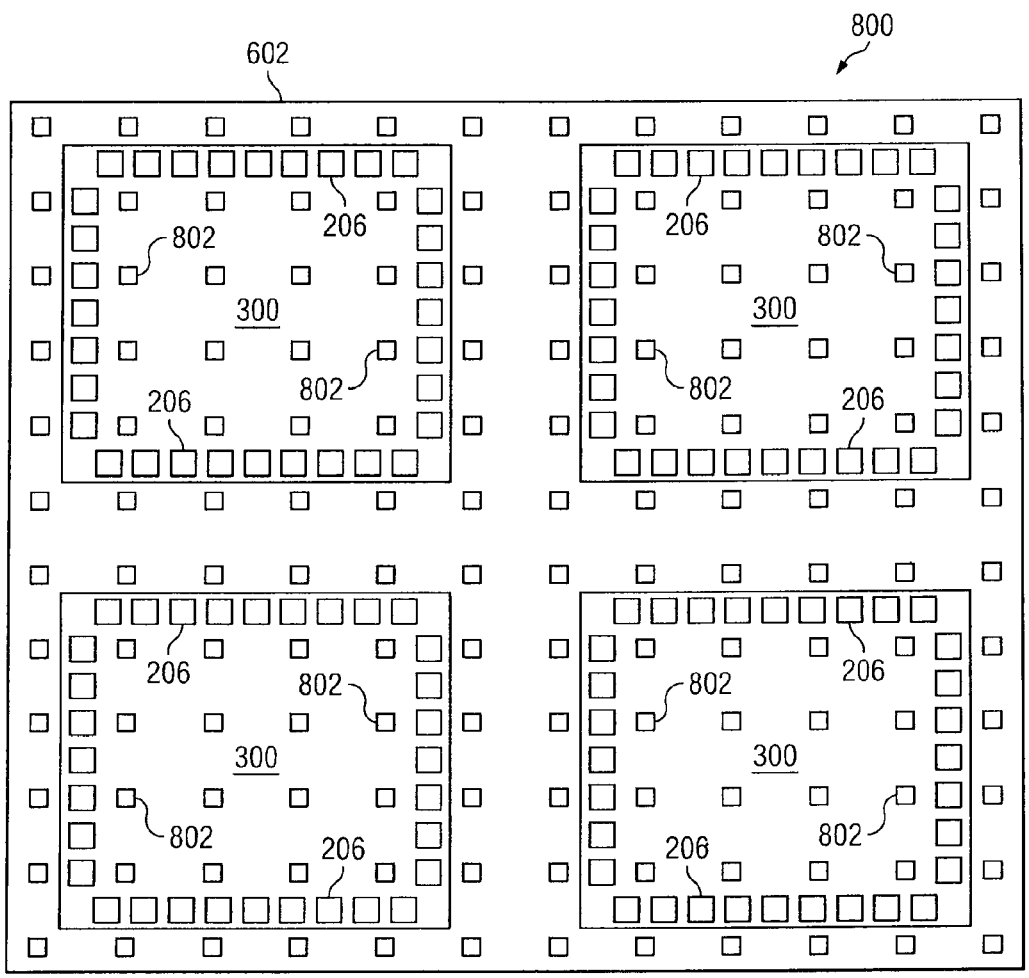

FIGS. 8A and 8B illustrate the formation of a plurality of under bump metallizations 802 (UBMs), some of which are formed over the organic material 602 in a sixth step 800 of the exemplary method of manufacturing. A UBM layer can act as a barrier preventing elements from diffusing between a pad on a substrate and the bump that connects a bump chip and packaging substrate. Additionally, a UBM layer improves adhesion between the bump and the pad on a substrate.

Moreover, a UBM layer may act as a wetting layer that ensures improved chip joint properties between a solder-based bump and the UBM layer. These advantages apply to a UBM layer comprising a two layer structure A/B-C, in which A is, for example, a non-refractory metal such as gold or nickel and B-C is a binary metal alloy such as titanium/tungsten (Ti/W), or a three-layer structure A/B/C in which A is a non-refractory metal and B and C are refractory metals.

As with the formation of RDL layers 702, the formation of the UBM 802 elements can proceed consistent with a variety of methodologies. UBM 802 deposition can occur through a variety of methods such as physical vapor deposition (e.g., sputtering or evaporation), chemical vapor deposition, or other like methods. In one example, UBM 802 is comprised of a metal or metal alloy containing at least one refractory metal. Additionally, UBM 802 may comprise a single refractory metal or metal alloy layer or multiple layers. UBM 802, in one manufacturing method, can be subjected to an annealing process in ambient hydrogen (H).

Figure 9A:
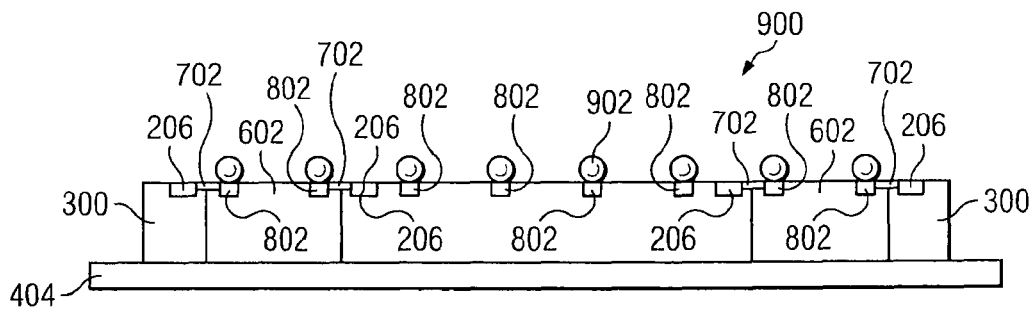
FIGS. 9A and 9B illustrate a seventh step in the exemplary method of manufacturing, including the formation of a plurality of bumps over the under bump metallizations.
Figure 9B:
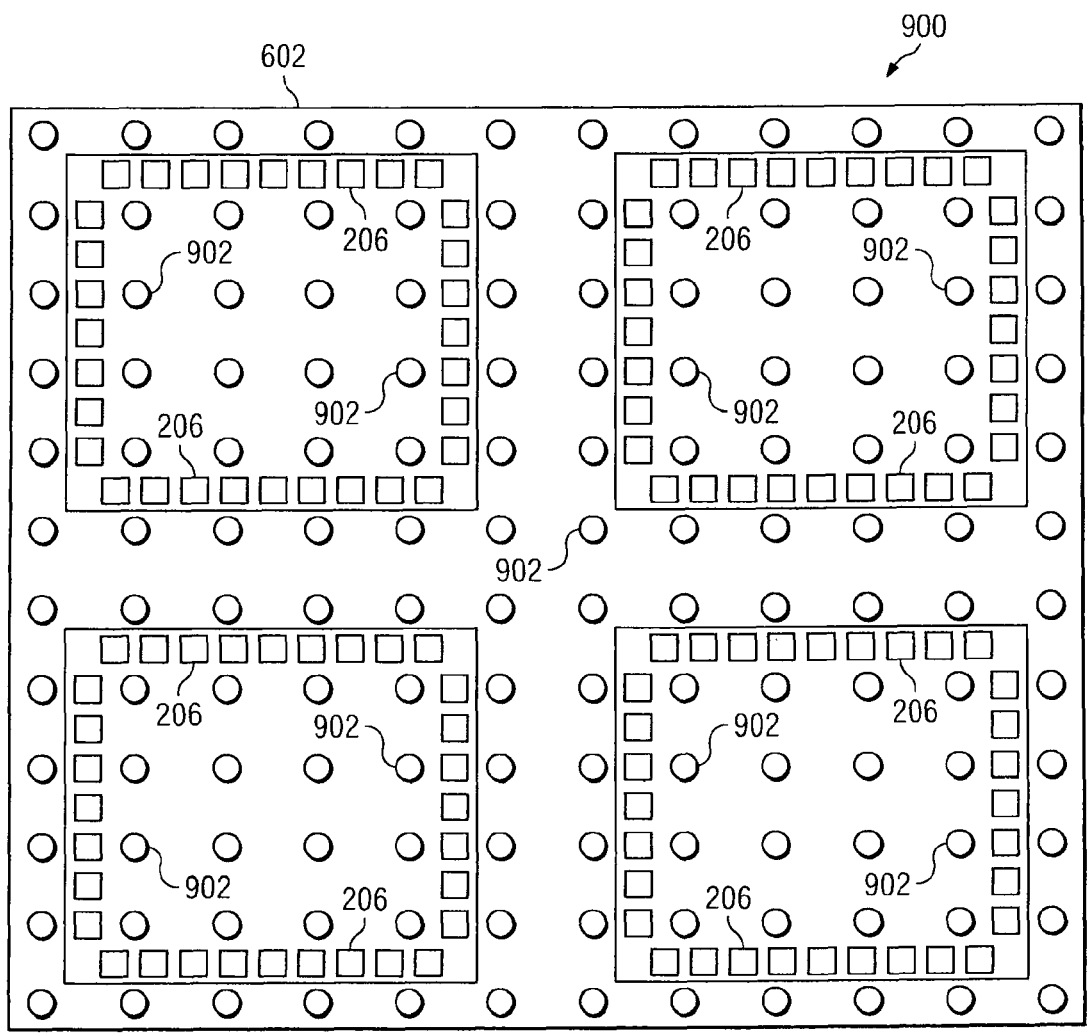

FIGS. 9A and 9B illustrate a seventh step 900 in the exemplary method of manufacturing, including the formation of a plurality of bumps 902 over the under bump metallizations 802. The bumps 902 can be formed consistent with a variety of techniques. In one example, bump electrodes 902 are formed using an electrolytic plating method including the steps of forming a predetermined resist pattern on the surface of the electronic parts by photolithography, and having the resist pattern grown to a predetermined thickness, using solder, or a metal such as gold (Au) or copper (Cu), or by a ball bump method of forming metal balls from a metal wire. Again, however, a variety of manufacturing techniques can be implemented to fabricate the bumps 902.

Figure 10A:
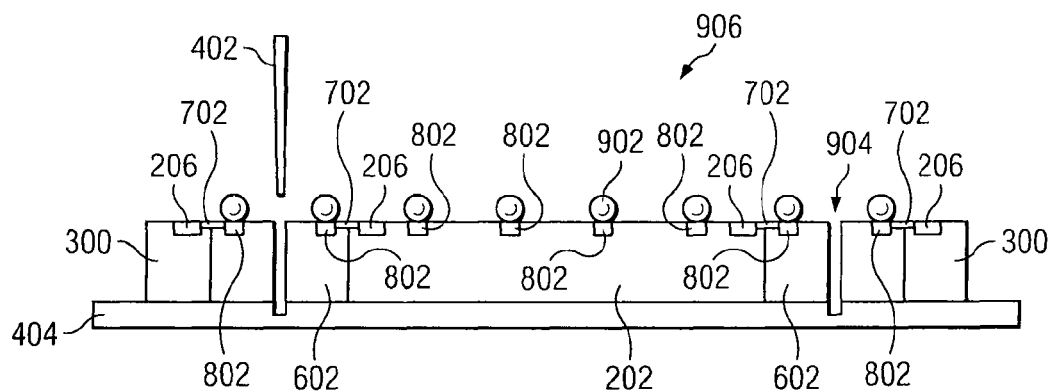
FIGS. 10A and 10B illustrate an eighth step in the exemplary method of manufacturing, depicting a second wafer singulation step.
Figure 10B:
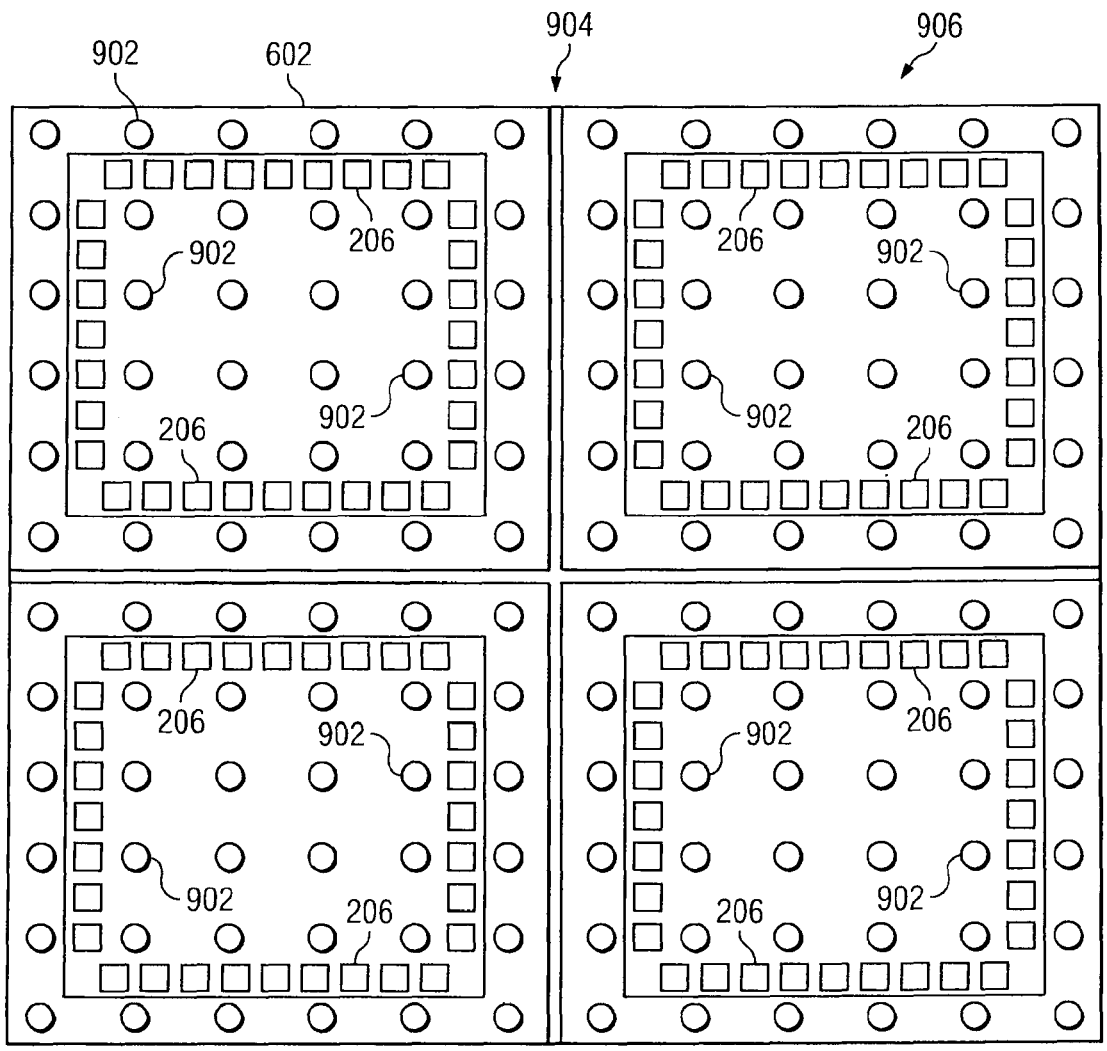

FIGS. 10A and 10B illustrate an eighth step 906 in the exemplary method of manufacturing, depicting a second wafer singulation step. The wafer assembly 300 is singulated for a second time by a cutting source 402 to form gaps 904. As would be understood by one skilled in the art, the various dies 200 shown in FIGS. 10A, and 10B, and the preceding exemplary figures represent a smaller portion of a totality of chips which are yielded from a particular wafer 300. As such, following the conclusion of the second singulation step, a majority of dies 200 are rendered to be like the embodiment shown in FIGS. 2A and 2B, where the organic material completely surrounds the peripheral surface of the die 202, and the bumps 204 are configured in rows along each side surface of the die as previously represented.

In one embodiment, following the singulation step depicted in FIGS. 10A and 10B, individual dies 200 are removed by a die pick and place process to remove each die 202 from the dicing tape 404.

Figure 11A:
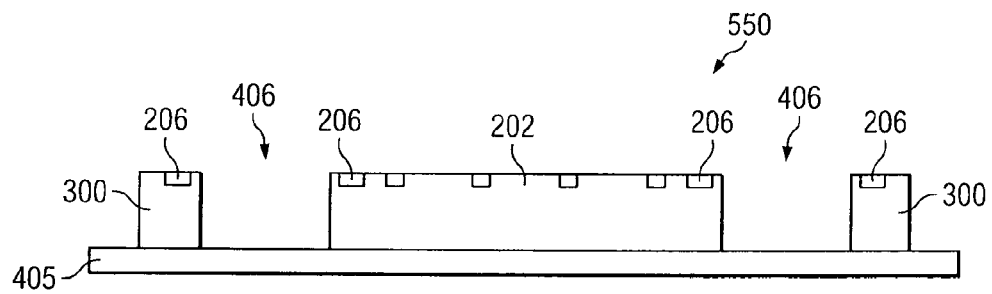
FIGS. 11A and 11B illustrate a third step in a second exemplary method of manufacturing the extended redistribution layers bumped wafer device shown in FIGS. 2A and 2B as seen in a side and top view, respectively.
Figure 11B:
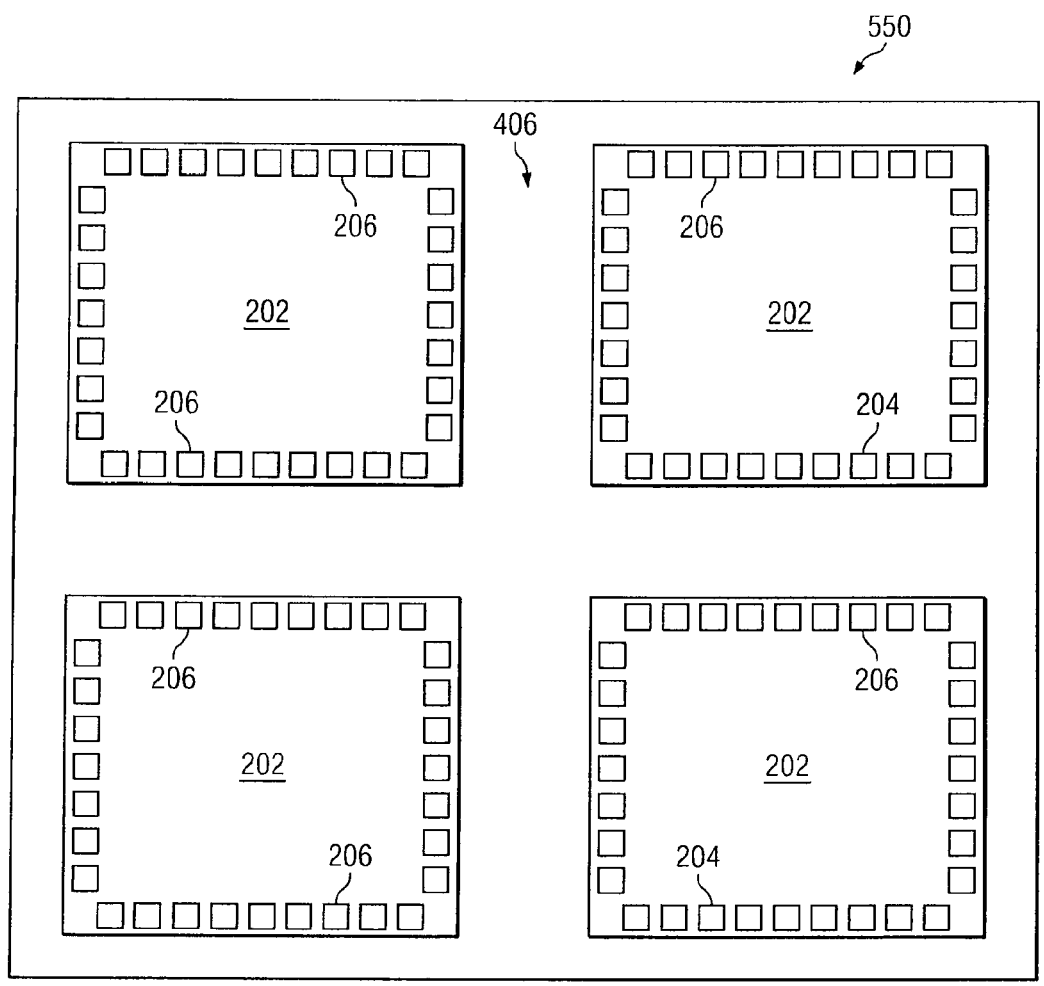

FIGS. 11A and 11B illustrate a third step in a second exemplary method of manufacturing the extended redistribution layers bumped wafer device 200 shown in FIGS. 2A and 2B as seen in a side and top view, respectively. The second method of manufacture as described shares the first two steps (i.e., providing a wafer and singulation into respective segments upon the dicing tape 404) as the first exemplary method previously described. In addition, various features (i.e., bond pads 206) are again seen.

As a next step, wafer 300 segments 550 are picked from the first dicing tape 404 and placed onto a so-called "wafer support system" 405 as seen. The wafer support system can logically include a second dicing tape 405. However, the wafer support system can also be a temporary wafer support system, such as glass, ceramic, laminate, or silicon (Si) substrate. In one embodiment, the sawn dies 202 are picked from the dicing tape 404 and placed onto the wafer support system 405 using conventional pick and place machines. The pick and place process renders a gap 406 having a predetermined width or distance 412 between respective segments 550.

Figure 12A:
FIGS. 12A and 12B illustrate a fourth step in the second exemplary method of manufacturing the extended redistribution layers bumped wafer device shown in FIGS. 2A and 2B.
Figure 12B:
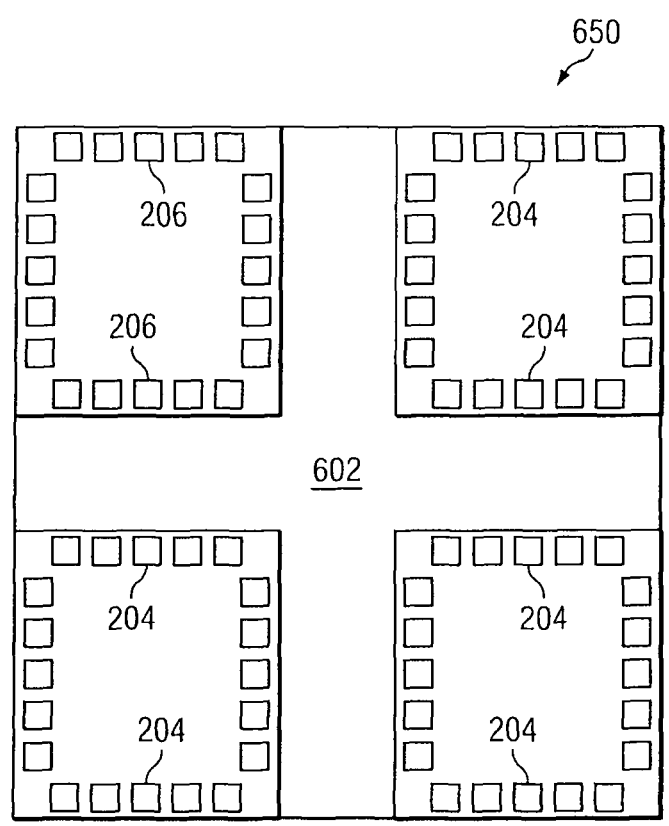

FIGS. 12A and 12B illustrate a fourth step in the second exemplary method of manufacturing the extended redistribution layers bumped wafer device 200 shown in FIGS. 2A and 2B. The organic material 602 is again applied to segments 650 in a similar spin-coating, needle dispensing, or other manner as previously described. Plane 642 of segments 650 is substantially coplanar with plane 654 of organic material 602.

Figure 13A:
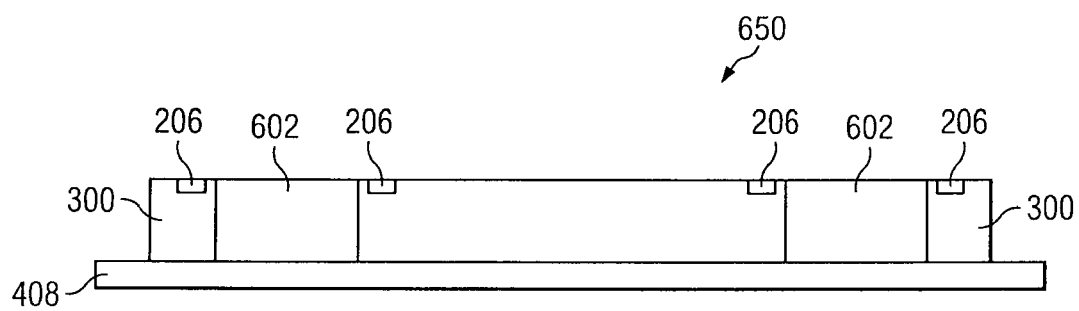
FIGS. 13A and 13B illustrate a fifth step in the second exemplary method of manufacturing the device shown in FIGS. 2A and 2B.
Figure 13B:
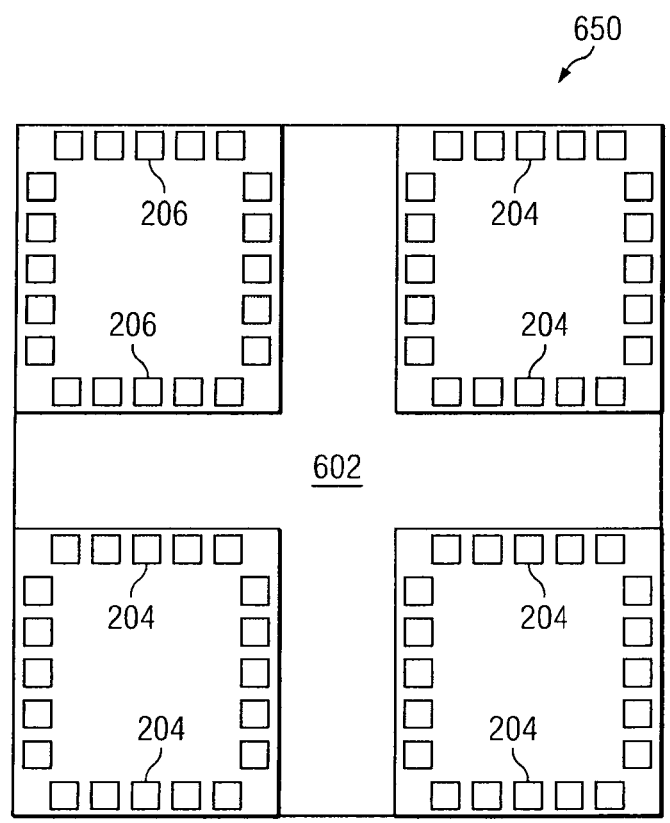

Turning to FIGS. 13A and 13B, a fifth step in the second exemplary method of manufacturing the device 200 shown in FIGS. 2A and 2B is shown. The recoated wafer 300 is transferred onto a second wafer support system 408. The second wafer support system can again include glass, silicon (Si) substrate materials, ceramic, and laminate materials.

Figure 14A:
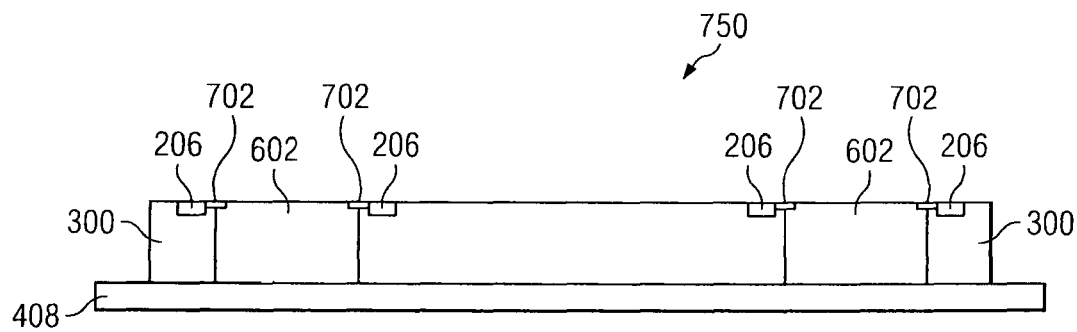
FIGS. 14A and 14B illustrate a sixth step in the second exemplary method of manufacturing the device shown in FIGS. 2A and 2B as seen in a side and top view, respectively.
Figure 14B:
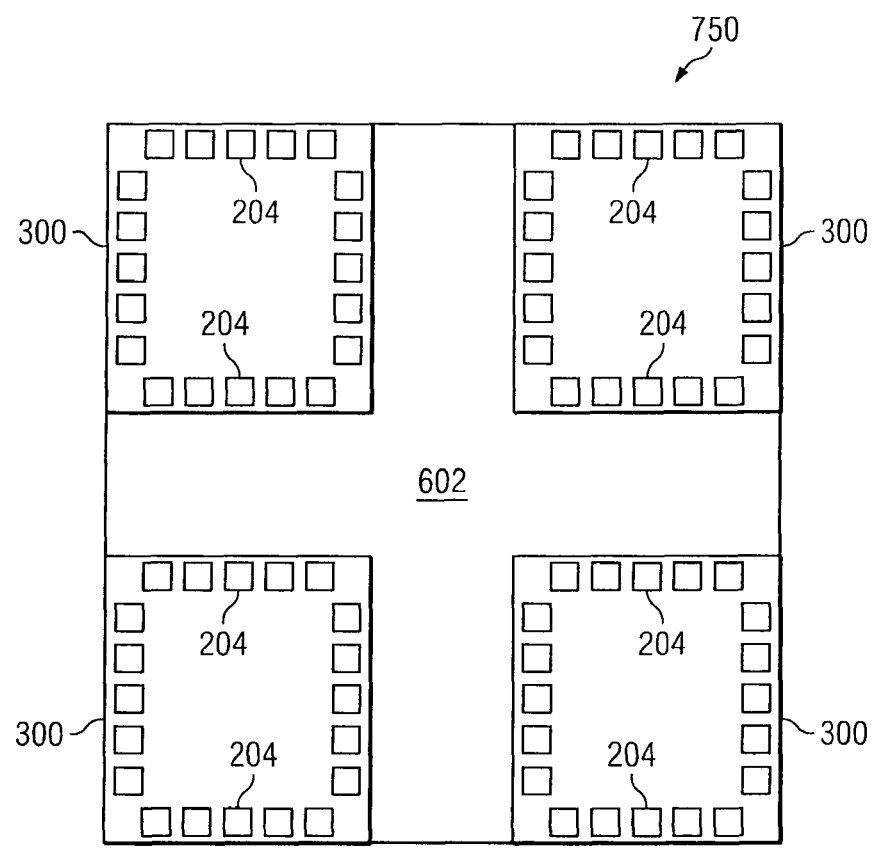

FIGS. 14A and 14B illustrate a sixth step in the second exemplary method of manufacturing the device 200 shown in FIGS. 2A and 2B as seen in a side and top view, respectively. In a step 750 similar to that shown in FIGS. 7A and 7B, redistribution layers 702 are formed over a portion of the organic material 602 to coincide with the bond pads 206.

Figure 15A:
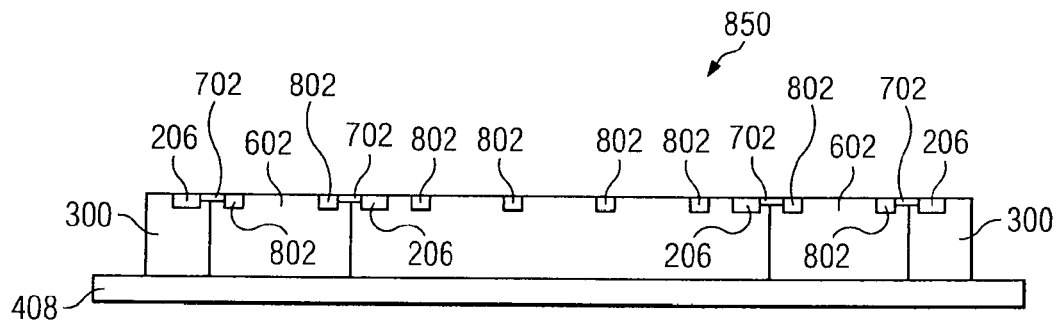
FIGS. 15A and 15B illustrate a seventh step in the second exemplary method of manufacturing the device.
Figure 15B:
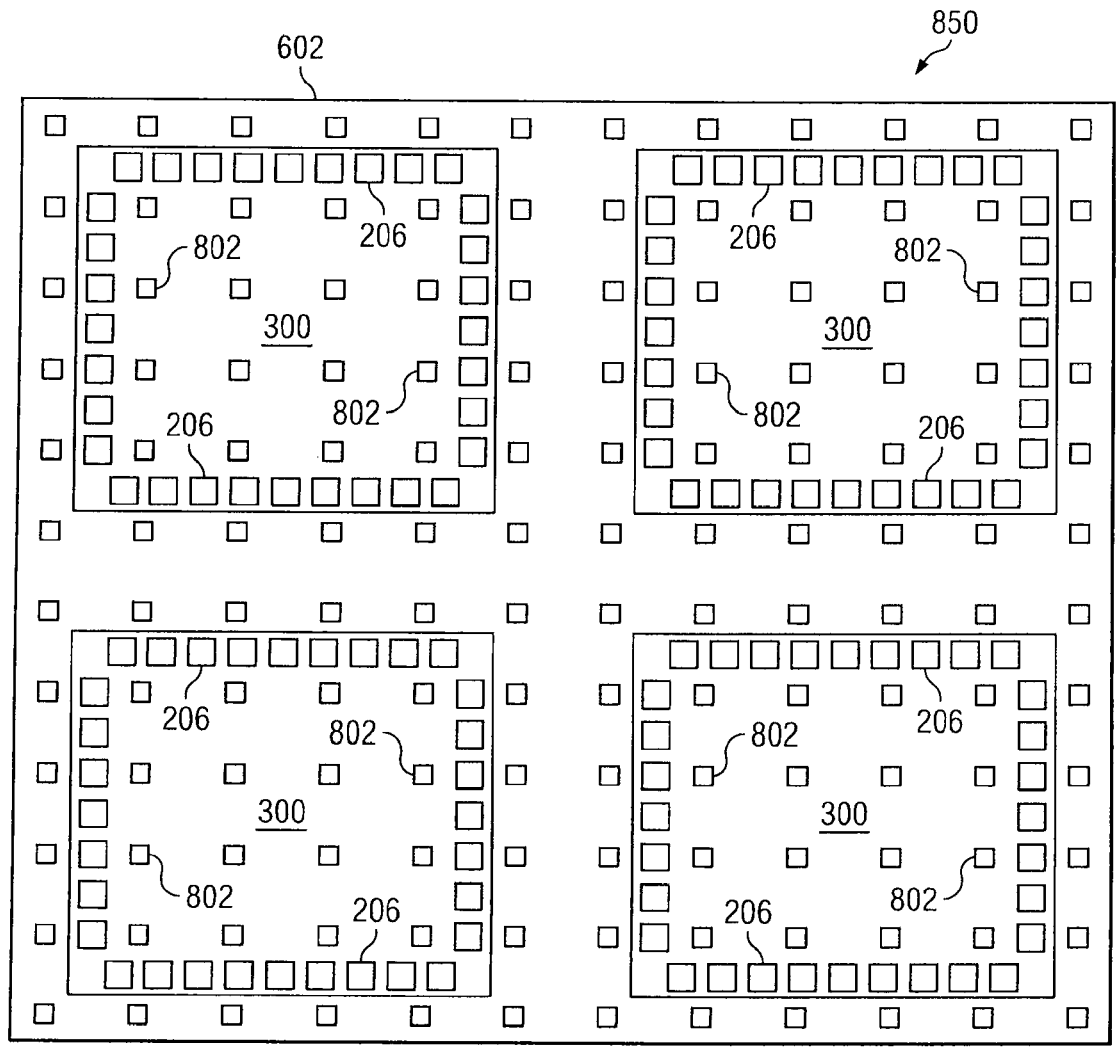

FIGS. 15A and 15B illustrate a seventh step 850 in the second exemplary method of manufacturing the device 200. Step 850 is again similar to that shown in FIGS. 8A and 8B of a UBM 802 deposition process.

Figure 16A:
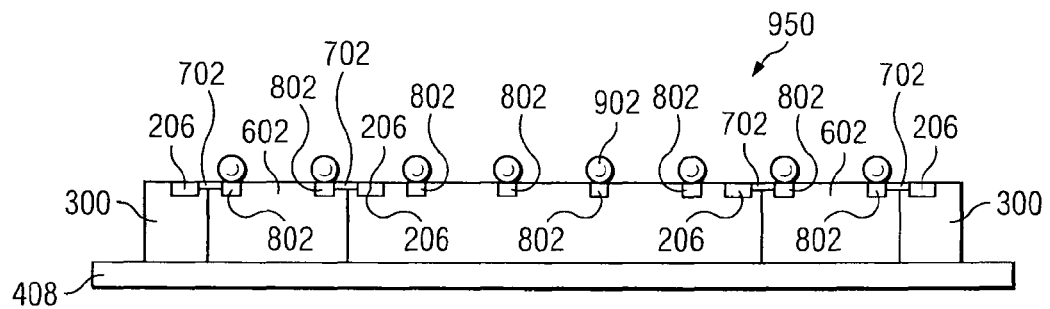
FIGS. 16A and 16B illustrate an eighth step in the second exemplary method of manufacturing the device.
Figure 16B:
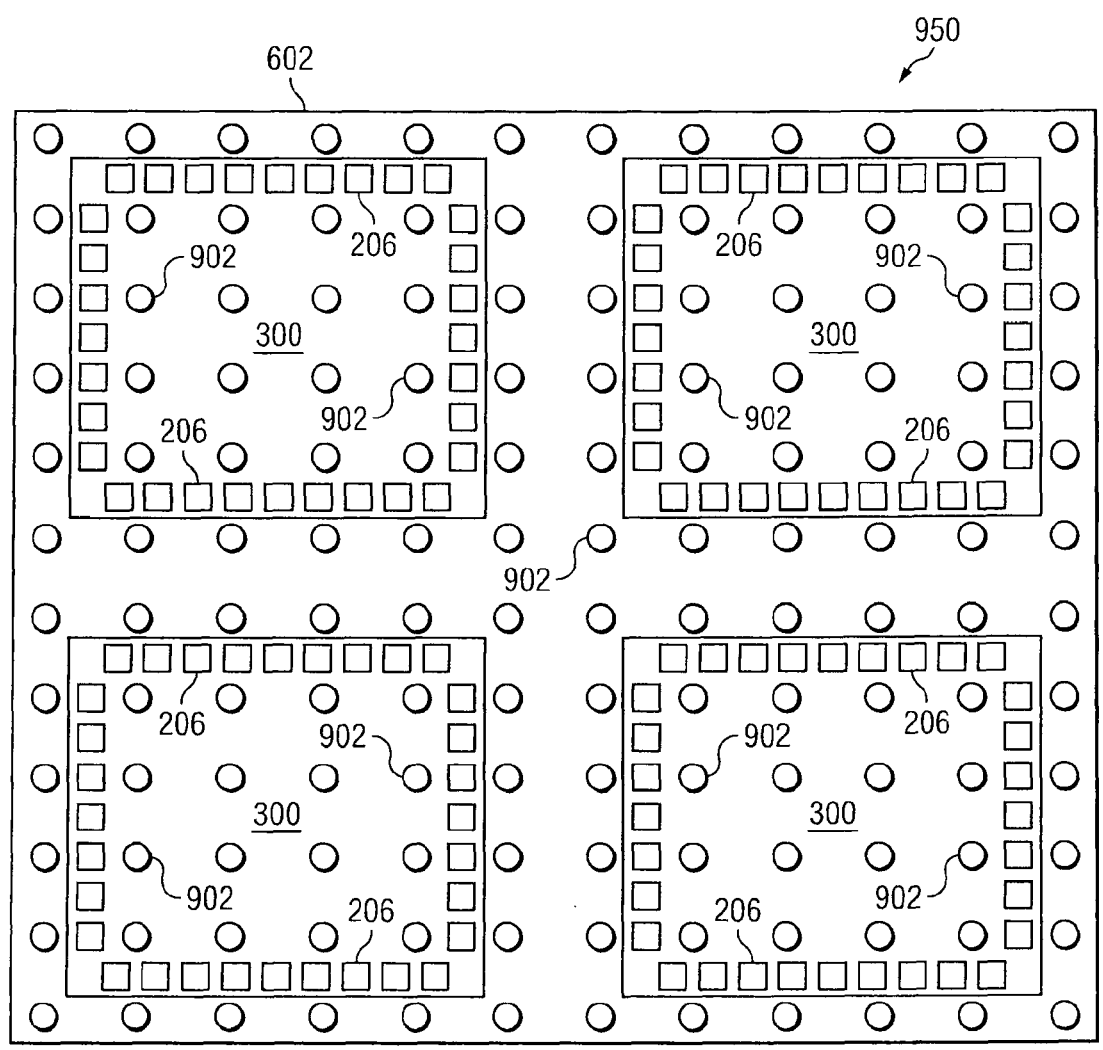

FIGS. 16A and 16B illustrate an eighth step 950 in the second exemplary method of manufacturing the device 200. A series of bumps 902 are deposited over the UBMs 802 in a process similar to that shown in FIGS. 9A and 9B.

Figure 17A:
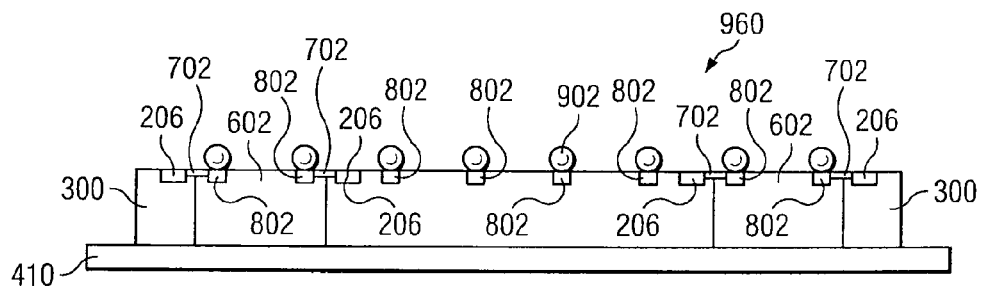
FIGS. 17A and 17B illustrate a ninth step in the second exemplary method of manufacturing the device.
Figure 17B:
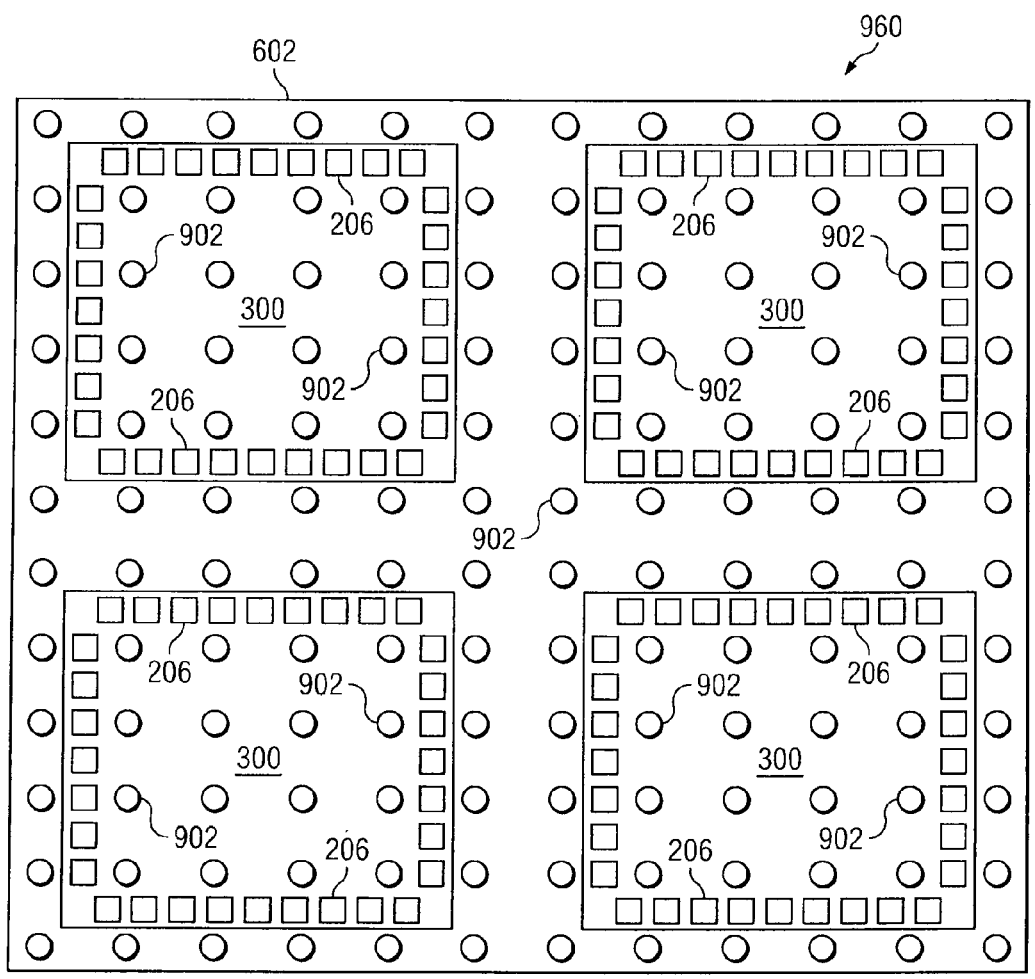
Figure 18A:
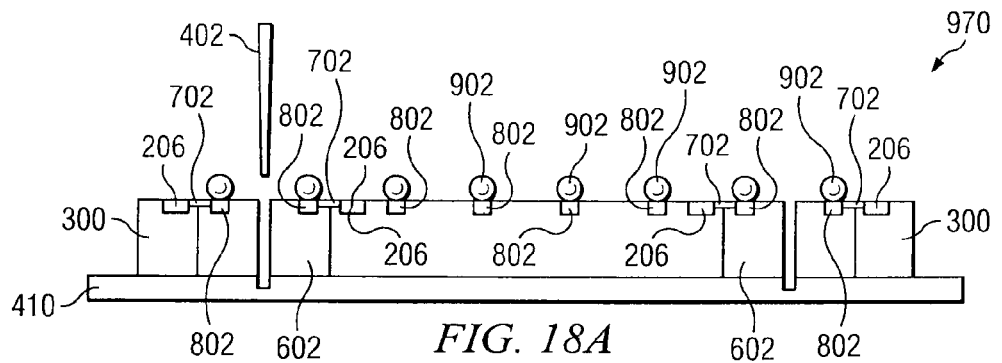
FIGS. 18A and 18B illustrate a tenth step in the second exemplary method depicting a second singulation process to render a series of singulated dies.
Figure 18B:
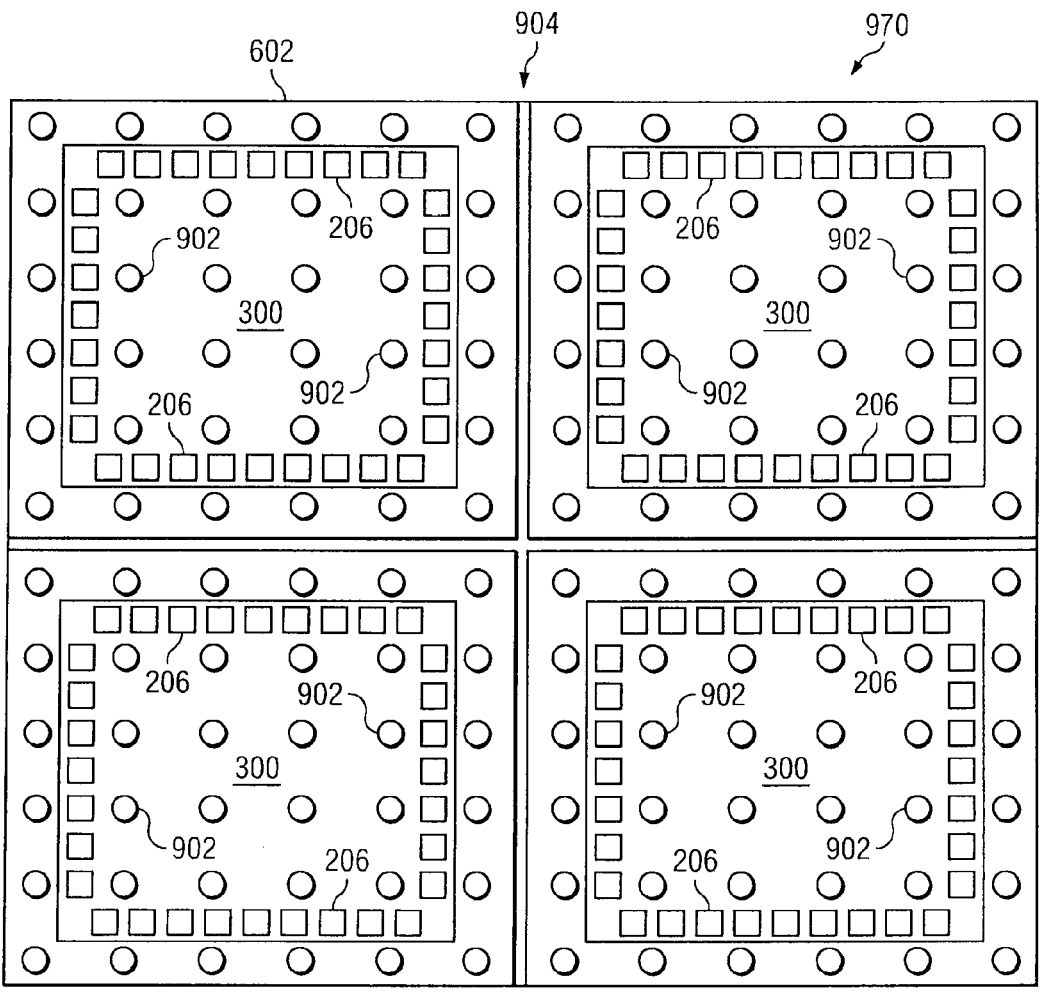

FIGS. 17A and 17B illustrate a ninth step 960 in the second exemplary method of manufacturing the device 200. The wafer 300 is transferred onto an additional dicing tape 410 as shown, where in FIGS. 18A and 18B, a tenth step 970 in the second exemplary method depicts a second singulation process to render a series of singulated dies 202. A pick and place process is utilized to then remove the plurality of singulated dies 202 from the dicing tape 410.

Semiconductor devices, such as device 200 incorporating an extended redistribution layer for a bumped wafer application, can provide a variety of functionality and flexibility in various applications. Use of the organic material 602 allows placement of the bumps 902 outside the die 202, which allows for additional input/output (I/O) throughput in a given surface area. In addition, by using the organic material 602 instead of wafer 300 material, the respective yield per wafer is increased. The organic material 602 can be configured to be as thick as needed to accommodate a variety of dies in a number of implementations.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:
    providing a plurality of semiconductor die with a space separating adjacent semiconductor die;
    depositing an insulating layer in the space separating the semiconductor die;
    forming a conductive layer over the insulating layer and semiconductor die;
    forming an under bump metallization (UBM) over the insulating layer and semiconductor die; and
    forming a plurality of bumps interconnect structures over the UBM, insulating layer, and semiconductor die.

2. The method of claim 1, further including forming the space separating the semiconductor die by:
    disposing the semiconductor die over a tape; and
    stretching the tape.

3. The method of claim 1, further including forming the space separating the semiconductor die by disposing the semiconductor die over a substrate with a physical separation between adjacent semiconductor die.

4. The method of claim 1, further including cutting through the insulating layer after forming the bumps to singulate the semiconductor die.

5. The method of claim 1, wherein the UBM includes a non-refractory metal and a binary metal alloy.

6. The method of claim 1, further including forming a surface of the insulating layer substantially coplanar with a surface of the semiconductor die.

7. A method of making a semiconductor device, comprising:
    providing a plurality of semiconductor die separated by a space;
    depositing an insulating layer in the space separating the semiconductor die;
    forming a conductive layer over the insulating layer and semiconductor die; and
    forming a plurality of bumps over the insulating layer and semiconductor die.

8. The method of claim 7, further including forming an under bump metallization (UBM) over the insulating layer and semiconductor die.

9. The method of claim 8, further including forming the bumps over the UBM.

10. The method of claim 8, wherein the UBM includes a refractory metal.

11. The method of claim 7, further including disposing the semiconductor die over a dicing tape.

12. The method of claim 7, further including disposing the semiconductor die over a substrate.

13. The method of claim 12, wherein the substrate includes glass, ceramic, laminate, or silicon.

14. A method of making a semiconductor device, comprising:
    providing a plurality of semiconductor die separated by a space;
    depositing an insulating material in the space separating the semiconductor die;
    forming a conductive layer over the insulating material and semiconductor die; and
    forming a plurality of interconnect structures over the insulating material and semiconductor die.

15. The method of claim 14, further including forming an under bump metallization over the insulating material.

16. The method of claim 14, further including cutting through the insulating material after forming the interconnect structures.

17. The method of claim 14, further including disposing the semiconductor die over a substrate.

18. The method of claim 17, further including stretching the substrate to increase a distance between the semiconductor die.

* * * * *